United States Patent
Murray et al.

(10) Patent No.: US 10,242,943 B2
(45) Date of Patent: Mar. 26, 2019

(54) FORMING A STACKED CAPACITOR

(71) Applicant: International Business Machines Corporation, Armonk, NY (US)

(72) Inventors: Conal E. Murray, Yorktown Heights, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/847,634

(22) Filed: Dec. 19, 2017

(65) Prior Publication Data
US 2018/0122740 A1 May 3, 2018

Related U.S. Application Data

(62) Division of application No. 15/178,245, filed on Jun. 9, 2016, now Pat. No. 9,875,959.

(51) Int. Cl.
*H01L 23/52* (2006.01)
*H01L 23/522* (2006.01)
(Continued)

(52) U.S. Cl.
CPC ........ *H01L 23/5223* (2013.01); *H01L 23/481* (2013.01); *H01L 25/0657* (2013.01); *H01L 2225/06544* (2013.01)

(58) Field of Classification Search
CPC .............. H01L 23/5223; H01L 23/481; H01L 25/0657
See application file for complete search history.

(56) References Cited

U.S. PATENT DOCUMENTS 5,675,184 A  10/1997  Matsubayashi et al.
5,879,985 A   3/1999  Gambino et al.
(Continued)

FOREIGN PATENT DOCUMENTS

CN   102104009 A   6/2011
CN   102104009 B   10/2012
WO   WO2011090440 A1   7/2011

OTHER PUBLICATIONS

Disclosed Anonymously, "Method for FCPGA/FCLGA stacked capacitors," IP.com No. IPCOM000139505D, IP.com Electronic Publication Date: Aug. 28, 2006 (3 pages).
(Continued)

*Primary Examiner* — Nathan W Ha
(74) *Attorney, Agent, or Firm* — Vazken Alexanian; Michael J. Chang, LLC (57) ABSTRACT

Stacked capacitor structures using TSVs are provided. In one aspect, a stacked capacitor structure includes: a first substrate having at least one first capacitor formed in a TSV in the first substrate; and a second substrate, bonded to the first substrate, having at least one second capacitor formed in a TSV in the second substrate, wherein the first capacitor and the second capacitor each comprises a first electrode and a dielectric that both surround a second electrode that is at a core of the TSV, wherein the dielectric separates the first electrode from the second electrode, and wherein the second substrate is bonded to the first substrate such that the first capacitor is stacked on the second capacitor. A method of forming a stacked capacitor structure is also provided.

20 Claims, 7 Drawing Sheets

(51) Int. Cl.
*H01L 23/48* (2006.01)
*H01L 25/065* (2006.01)

(56) References Cited

U.S. PATENT DOCUMENTS

| | | | |
|---|---|---|---|
| 6,461,914 | B1 | 10/2002 | Roberts et al. |
| 6,670,237 | B1 | 12/2003 | Loh et al. |
| 6,764,915 | B2 | 7/2004 | Lee |
| 6,794,729 | B2 | 9/2004 | Mon et al. |
| 7,317,221 | B2 | 1/2008 | Chang et al. |
| 8,310,061 | B2 | 11/2012 | Chandrasekaran |
| 8,508,019 | B2 | 8/2013 | Riess |
| 8,623,733 | B2* | 1/2014 | Chen .................. C23C 16/0272 438/380 |
| 8,779,849 | B2 | 7/2014 | Hollis |
| 9,000,577 | B2 | 4/2015 | Droege et al. |
| 9,263,422 | B2 | 2/2016 | Droege et al. |
| 2012/0058605 | A1* | 3/2012 | Fujii ................. H01L 21/76898 438/118 |
| 2012/0092062 | A1* | 4/2012 | Lee ......................... H01L 22/22 327/525 |
| 2013/0001676 | A1* | 1/2013 | Bartley ............. H01L 29/66666 257/330 |
| 2013/0083589 | A1* | 4/2013 | Or-Bach ............... G11C 11/406 365/149 |
| 2013/0140708 | A1 | 6/2013 | Lin et al. |
| 2013/0293292 | A1 | 11/2013 | Droege et al. |
| 2014/0021633 | A1 | 1/2014 | Lee et al. |
| 2014/0054742 | A1 | 2/2014 | Katti |
| 2014/0061855 | A1 | 3/2014 | Kuo et al. |
| 2014/0159200 | A1 | 6/2014 | Loke et al. |
| 2015/0221613 | A1* | 8/2015 | Andry ................. H01L 25/0657 257/770 |

OTHER PUBLICATIONS

Disclosed Anonymously, "Method for stacked capacitors for package real estate savings and loop inductance improvement," IP.com No. IPCOM000130479D, IP.com Electronic Publication Date: Oct. 25, 2005 (5 pages).

Disclosed Anonymously, "Stacked Capacitors to Enable More Capacitors Within the Limited Keep-In-Zone on Flip Chip Ball Grid Array Packages," IP.com No. IPCOM000135648D, IP.com Electronic Publication Date: Apr. 20, 2006 (4 pages).

English Abstract translation of CN102104009A by Huijuan Wang et al., Jun. 22, 2011.

English Abstract translation of CN102104009B by Huijuan Wang et al., Oct. 10, 2012.

List of IBM Patents or Applications Treated as Related (2 pages).

* cited by examiner

FORMING A STACKED CAPACITOR

CROSS-REFERENCE TO RELATED APPLICATION(S)

This application is a divisional of U.S. application Ser. No. 15/178,245 filed on Jun. 9, 2016, the disclosure of which is incorporated by reference herein.

FIELD OF THE INVENTION

The present invention relates to capacitor structures, and more particularly, to stacked capacitor structures using through-substrate vias (TSVs) and techniques for formation thereof.

BACKGROUND OF THE INVENTION

The capacitance of conventional, two-dimensional, metal-insulator-metal capacitors associated with microelectronic applications is limited to the die or chip area they possess. One method to increase capacitance involves using thinner insulating layers that may break down or new insulating materials.

Because the area that capacitors take up on the die detracts from space which can be used for devices and other structures, a method is sought that increases the effective capacitance without increasing the area it spans on the chip.

SUMMARY OF THE INVENTION

The present invention provides stacked capacitor structures using through-substrate vias (TSVs) and techniques for formation thereof. In one aspect of the invention, a stacked capacitor structure is provided. The stacked capacitor structure includes: a first substrate having at least one first capacitor formed in a TSV in the first substrate; and a second substrate, bonded to the first substrate, having at least one second capacitor formed in a TSV in the second substrate, wherein the first capacitor and the second capacitor each comprises a first electrode and a dielectric that both surround a second electrode that is at a core of the TSV, wherein the dielectric separates the first electrode from the second electrode, and wherein the second substrate is bonded to the first substrate such that the first capacitor is stacked on the second capacitor.

In one aspect of the invention, a method of forming a stacked capacitor structure is provided. The method includes the steps of: forming at least one first capacitor in a TSV in a first substrate; forming at least one second capacitor in a TSV in a second substrate, wherein the first capacitor and the second capacitor each comprises a first electrode and a dielectric that both surround a second electrode that is at a core of the TSV, and wherein the dielectric separates the first electrode from the second electrode; and bonding the second substrate to the first substrate such that the first capacitor is stacked on the second capacitor.

A more complete understanding of the present invention, as well as further features and advantages of the present invention, will be obtained by reference to the following detailed description and drawings.

DETAILED DESCRIPTION OF PREFERRED EMBODIMENTS

Figure 1:
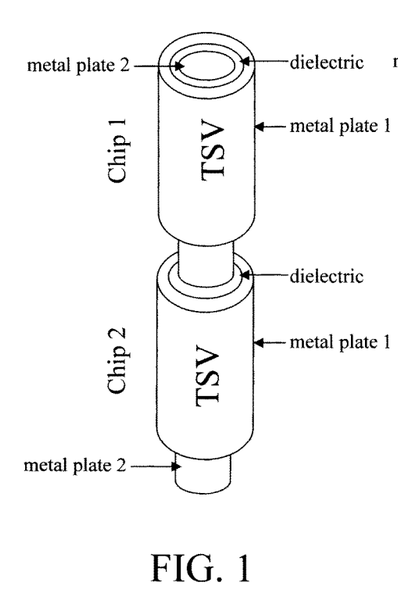
FIG. 1 is a diagram illustrating the present through-substrate via (TSV)-based stacked capacitor design having a front-to-back configuration according to an embodiment of the present invention.

Provided herein are techniques for creating stacked capacitor structures through the use of through-substrate vias (TSV) in silicon (Si) substrates that are stacked and electrically connected. By utilizing the fabrication steps associated with creating the TSVs in Si substrates, a unique, metal-insulator-metal capacitor structure can be created. This concept is shown illustrated in FIGS. 1 and 2. For instance, as shown in FIG. 1 the front-to-back bonding of two wafer (labeled "Chip 1" and "Chip 2"), each having a TSV, can be used to form a stacked capacitor structure via the TSVs. Namely, as shown in FIG. 1, the stacked capacitor structure includes at least two TSVs that are electrically connected to one another. Each TSV capacitor includes a first metal plate (metal plate 1—that serves as a first electrode of the capacitor) which surrounds a dielectric. The first metal plate and the dielectric surround a second metal plate (metal plate 2—that forms the core of the TSV and serves as the second electrode of the capacitor). Thus, the first electrode plate and the dielectric are concentric with the second electrode/TSV core, with the dielectric separating the first and second electrodes. The result is a metal-insulator-metal capacitor structure having vastly increased area as compared to conventional capacitor designs. Further, since the design is vertically integrated, it occupies less area on the respective chips than conventional two-dimensional designs. It is notable that while the stacked design shows the TSVs perfectly vertically aligned with one another some level of misalignment between the TSVs is permissible as long as they remain electrically connected to one another. For instance, as in the examples provided below, landing pads can be formed to the TSVs which increases the contact area, thereby facilitating alignment of the TSVs. As long as the TSV makes contact with the respective landing pad, the capacitor structure will function properly even if there is some misalignment between the TSVs.

Figure 2:
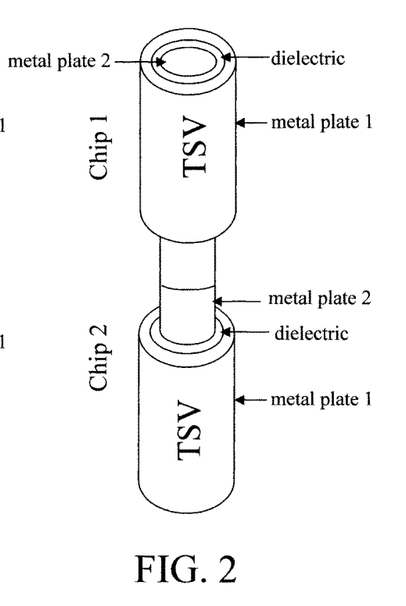
FIG. 2 is a diagram illustrating the present TSV-based stacked capacitor design having a back-to-back configuration according to an embodiment of the present invention.

In the configuration shown in FIG. 1, the front of one wafer (Chip 2) is bonded to the back of the other (Chip 1), hence front-to-back bonding. Other wafer bonding schemes are, however, contemplated herein. For instance, as shown in FIG. 2, back-to-back wafer bonding configurations may be employed where, for example, the back of one wafer (Chip 2) is bonded to the back of the other (Chip 1), hence back-to-back bonding. This bonding scheme too results in the present stacked capacitor structure.

Figure 3:
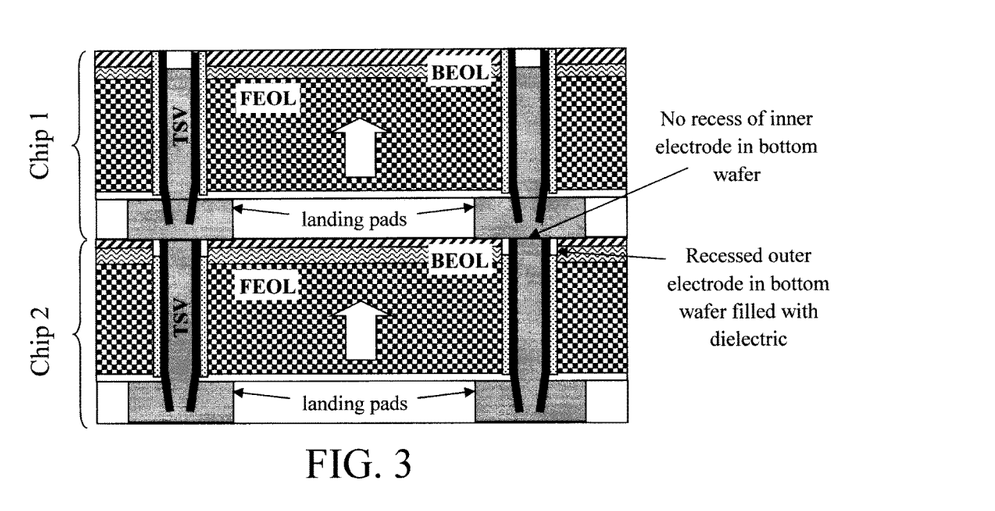
FIG. 3 is a cross-sectional diagram illustrating front-to-back wafer bonding such that the front sides of the TSVs in a second wafer (Chip 2) are in contact with the landing pads to the backside of the TSVs in a first wafer (Chip 1) according to an embodiment of the present invention.
Figure 4:
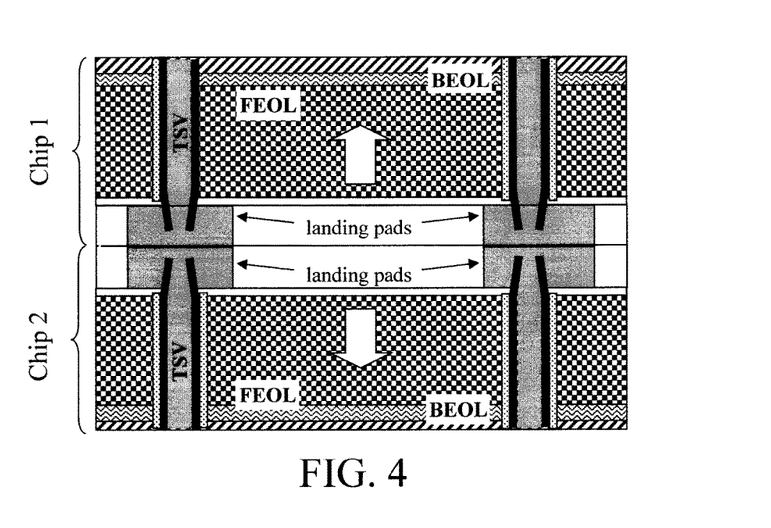
FIG. 4 is a cross-sectional diagram illustrating back-to-back wafer bonding such that the landing pads to the backside of the TSVs in the second wafer (Chip 2) are in contact with the landing pads to the backside of the TSVs in the first wafer (Chip 1) according to an embodiment of the present invention.
Figure 16:
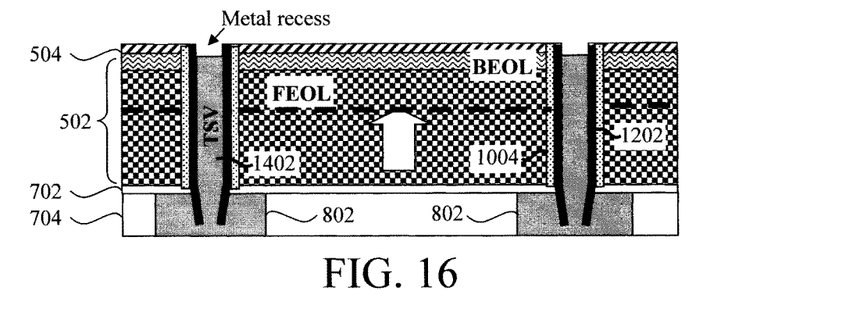
FIG. 16 is a cross-sectional diagram illustrating the metal core having been recessed in the vias according to an embodiment of the present invention.
Figure 16A:
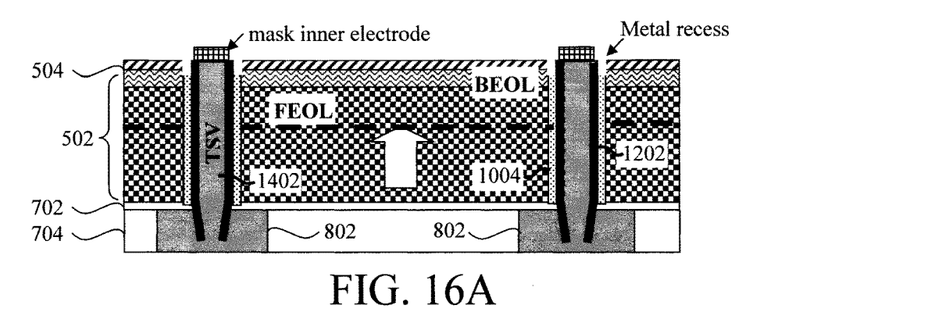
FIG. 16A is a cross-sectional diagram illustrating alternatively the metallic liner having been recessed in the vias according to an embodiment of the present invention.
Figure 17:
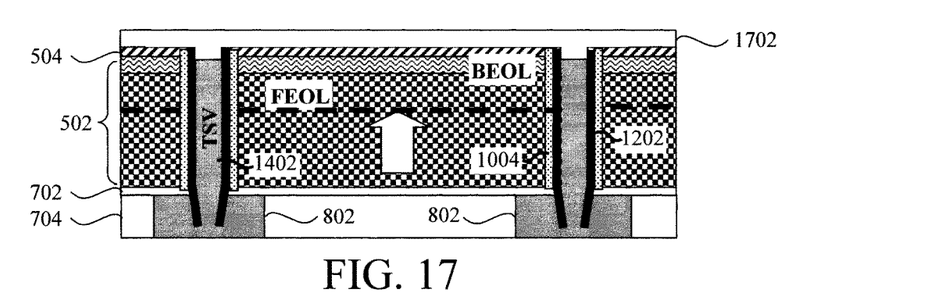
FIG. 17 is a cross-sectional diagram illustrating a dielectric having been deposited onto the substrate, filling the recesses according to an embodiment of the present invention.

Exemplary wafer bonding structures incorporating the present TSV-based stacked capacitor design are shown in FIGS. 3 (front-to-back bonded wafers) and 4 (back-to-back bonded wafers). As shown in FIG. 3, a plurality of the TSV capacitors (as described above) are fabricated in both a first wafer (Chip 1) and a second wafer (Chip 2). According to an exemplary embodiment, the first wafer and the second wafer are processed in the same manner (see exemplary process flow described below) including the placement and formation of the TSV capacitors. As shown in FIG. 3, landing pads to the TSVs can be formed on the back side of each of the wafers. The first wafer and the second wafer are then bonded together in a front-to-back manner such that the front sides of the TSVs in the second wafer (Chip 2) are in contact with the landing pads to the backside of the TSVs in the first wafer (Chip 1). Arrows are used to indicate the orientation of the wafers, i.e., the arrows point to the front side of the wafers. It is notable that, as will be described in detail below, while the same general processes may be used to create both the top and bottom wafers, some individual treatment may be needed specifically for the bottom wafer (Chip 2 in FIG. 3) in the front-to-back bonding scheme to recess the outer electrode in order to prevent shorting to the inner electrode post wafer bonding. See FIG. 16A—described below.

FIG. 4 illustrates the wafers/TSVs processed in the same manner, except that the bonding occurs in a back-to-back manner. Namely, as shown in FIG. 4, the first wafer and the second wafer are bonded together in a back-to-back manner such that the landing pads to the backside of the TSVs in the second wafer (Chip 2) are in contact with the landing pads to the backside of the TSVs in the first wafer (Chip 1). Again, arrows are used to indicate the orientation of the wafers, i.e., the arrows point to the front side of the wafers.

An exemplary process flow for fabricating the stacked capacitor designs shown in FIGS. 3 and 4 is now described by way of reference to FIGS. 5-20. It is notable that the process described and depicted in the following figures illustrates the process as it pertains to forming the TSV-based capacitors in a single wafer. However, as provided above, the present techniques involve wafer bonding at least two of these wafers (e.g., Chip 1 and Chip 2) to form the stacked TSV capacitor structure. Thus, it is to be understood that the present process flow is performed on multiple wafers in order to produce the (multiple) wafers for the wafer bonding process.

Figure 5:
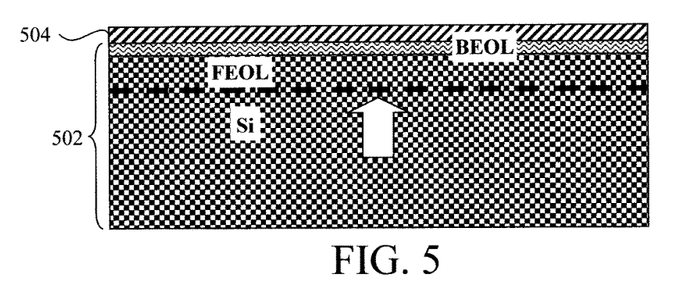
FIG. 5 is a cross-sectional diagram illustrating a starting structure for fabricating the present TSV-based stacked capacitor design which includes a substrate on which front-end-of-line (FEOL) and back-end-of-line (BEOL) structures have been constructed, and a dielectric passivation layer having been deposited onto the substrate according to an embodiment of the present invention.

As shown in FIG. 5, the process begins with a substrate 502. Substrate 502 can generally include any substrate on which one wants to build capacitors. For instance, as shown in FIG. 5, the substrate includes a standard silicon (Si) wafer on which front-end-of-line (FEOL) and back-end-of-line (BEOL) structures have been constructed. By way of example only, various devices, such as transistors (not shown) are commonly fabricated in the FEOL, and interconnects (not shown) are commonly fabricated in the BEOL. The configuration of the FEOL and BEOL are however not the focus of the present description, and thus these regions of the wafer are simply labeled "FEOL" and "BEOL," respectively. Further, it is notable that the substrate 502 can include multiple FEOL and/or BEOL levels as needed for a given application.

To begin the capacitor fabrication process, a dielectric passivation layer 504 is deposited onto the substrate 502 (i.e., onto the last BEOL level). A passivation layer serves to protect the underlying metallization layers from environmental elements as well as subsequent processing effects. Suitable dielectrics for passivation layer 504 include, but are not limited to, silicon nitride (SiN), silicon carbide (SiC), and/or silicon dioxide ($SiO_2$). As above, arrows are used in the following figures to denote the front and back sides of the respective wafers. Namely, the arrows in each figure point to the front side of the wafer.

Figure 6:
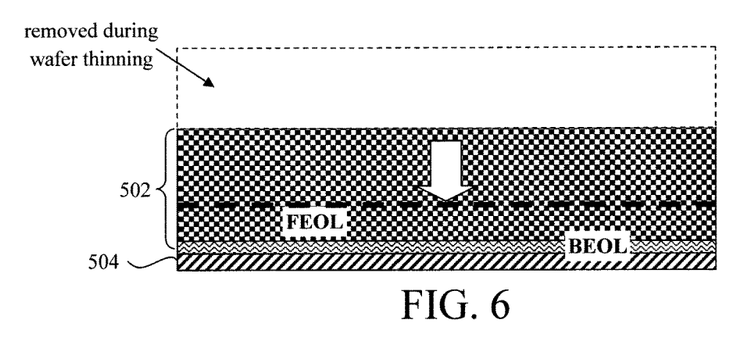
FIG. 6 is a cross-sectional diagram illustrating the substrate having been flipped upside down, and an etch having been used to thin down the backside substrate thickness according to an embodiment of the present invention.

The substrate is then thinned. See FIG. 6. As shown in FIG. 6, the substrate is flipped upside down, and an etch is used to thin down the backside substrate thickness. By way of example only, suitable wafer thinning techniques that may be employed include, but are not limited to, chemical mechanical polishing (CMP), wet etching, and mechanical grinding. According to an exemplary embodiment, the substrate 502 is thinned to a thickness of from about 50 micrometers (μm) to about 200 μm, and ranges therebetween, e.g., about 100 μm.

Figure 7:
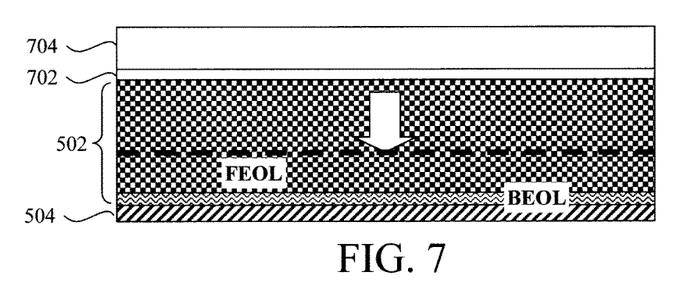
FIG. 7 is a cross-sectional diagram illustrating a passivation layer and a dielectric layer having been deposited on the backside of the substrate according to an embodiment of the present invention.

A passivation layer 702 and a dielectric layer 704 are then deposited on the backside of the substrate 502. See FIG. 7. Namely, as shown in FIG. 7, the passivation layer 702 is deposited onto the backside of the substrate 502. The dielectric layer 704 is then deposited onto the passivation layer 702. As provided above, suitable dielectrics for use in forming the passivation layer 702 include, but are not limited to, SiN, SiC and/or $SiO_2$. Landing pads for the TSVs will be formed in the dielectric layer 704. Thus, the dielectric 704 can be formed from a standard inter layer dielectric (ILD), such as $SiO_2$. Further, to facilitate patterning the dielectric layer 704 respective to the passivation layer 702, it may be desirable to employ different materials (i.e., materials that can be etched selectively to one another). Thus, for example, if the dielectric 704 is formed from an oxide such as $SiO_2$, it may be desirable to form the passivation layer 702 from a nitride such as SiN. That way, when patterning the dielectric 704 to form the landing pads (see below), the passivation layer 702 can act as etch stop in that process.

Landing pads 802 are then formed in the dielectric 704. See FIG. 8. It is notable that one landing pad 802 is formed for each of the TSVs that will be formed in the substrate 502. While the present example depicts the formation of two landing pads and two TSVs, that is merely an example. Namely, more or fewer of these structures than shown may be formed via the present process in the same manner described.

Figure 8:
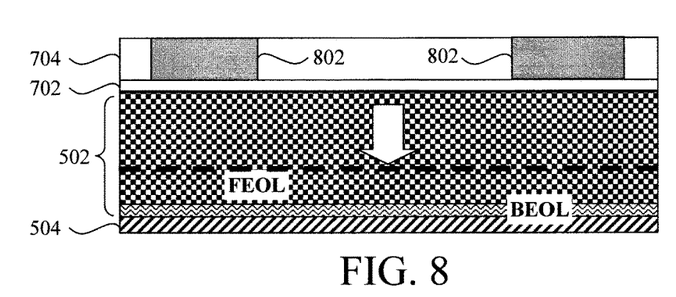
FIG. 8 is a cross-sectional diagram illustrating landing pads having been formed in the dielectric according to an embodiment of the present invention.

Standard metallization techniques may be employed to form the landing pads 802 in the dielectric 704. For instance, standard lithography and etching techniques can be used to pattern the dielectric 704 with the footprint and location of the landing pads 802. As provided above, the passivation layer 702 can act as an etch stop during the patterning process. The pattern can then be filled with a suitable conductor, such as a metal like copper (Cu).

The substrate 502 is then flipped back (right side up—see arrow), and vias 902 are formed extending through the passivation layer 504, through the substrate 502, and stopping on the passivation layer 702. See FIG. 9. Each via 902 corresponds to one of the TSVs that will be formed in the substrate 502. Thus, the vias 902 are patterned having the footprint and location of the TSVs. Standard lithography and etching techniques can be used to pattern the vias 902.

Figure 9:
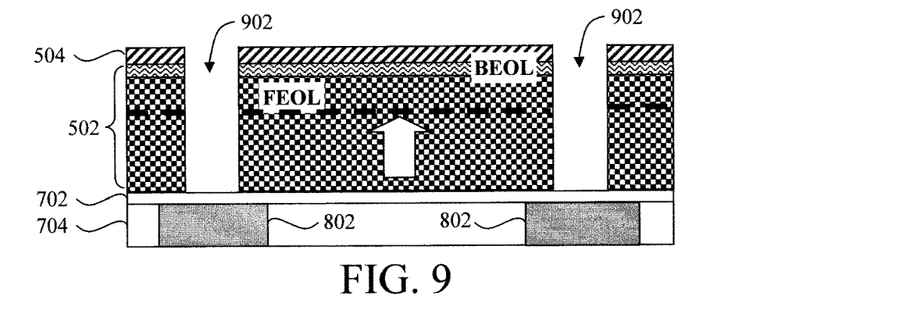
FIG. 9 is a cross-sectional diagram illustrating the substrate having been flipped right side up and vias having been formed in the substrate over the landing pads according to an embodiment of the present invention.

As provided above, the present TSV capacitors include a metal core surrounded by a concentric dielectric layer and a concentric metal layer, forming a metal-insulator-metal structure. This TSV capacitor structure will be built in the vias 902 beginning with the outer metal layer (i.e., the first electrode of the capacitor), followed by the dielectric, and then the metal core (i.e., the second electrode of the capacitor).

Figure 10:
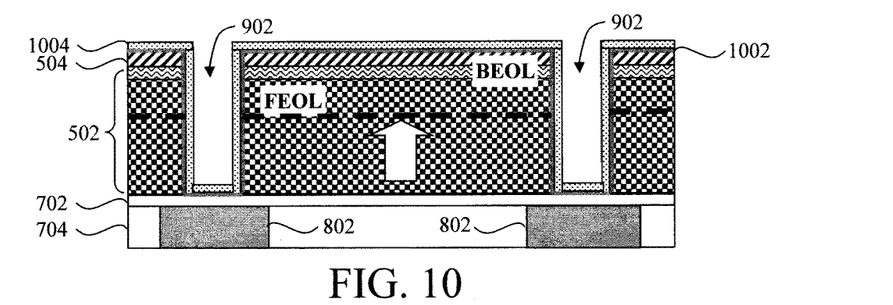
FIG. 10 is a cross-sectional diagram illustrating an adhesion layer having been deposited into and lining the vias, and a metallic liner having been deposited onto the adhesion layer according to an embodiment of the present invention.

To begin formation of the TSV capacitors in the vias 902, an adhesion layer 1002 is deposited into and lining the vias 902. Suitable materials for forming the adhesion layer 1002 include, but are not limited to, tantalum nitride (TaN), titanium nitride (TiN), tungsten nitride (WN), $SiO_2$, and/or SiN. According to an exemplary embodiment, the adhesion layer 1002 is deposited using a conformal deposition process such as atomic layer deposition (ALD) or chemical vapor deposition (CVD) and, as shown in FIG. 10, lines the bottom and sidewalls of the vias 902 and is present on a top surface of the passivation layer 504. A metallic liner 1004 is then deposited onto the adhesion layer 1002. The metallic liner 1004 is the outer metal layer (i.e., the first electrode) for the TSV capacitor, and may also be referred to herein as a first metal/first metal layer. Suitable materials for forming the metallic liner 1004 include, but are not limited to, ruthenium (Ru), cobalt (Co), iridium (Ir), gold (Au), titanium (Ti) and/or tantalum (Ta). According to an exemplary embodiment, the metallic liner 1004 is also deposited using a conformal deposition process such as ALD or CVD and, as shown in FIG. 10, lines the adhesion layer 1002 along the bottom and sidewalls of the vias 902 and above the passivation layer 504.

Figure 11:
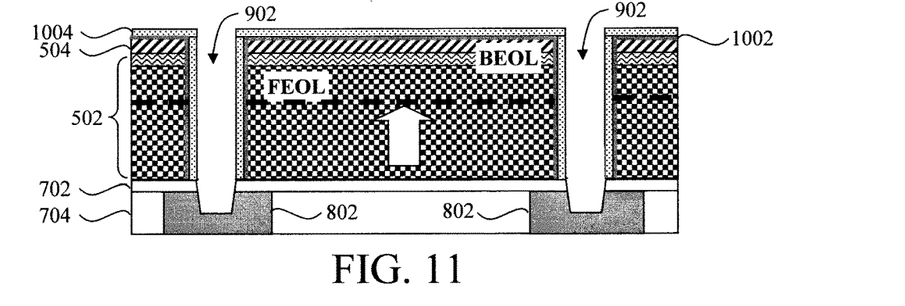
FIG. 11 is a cross-sectional diagram illustrating the materials at the bottom of the vias having been removed, exposing the landing pads beneath the vias according to an embodiment of the present invention.

As shown in FIG. 11, the materials at the bottom of the vias 902 are removed, exposing the landing pads 802 beneath the vias 902. For instance, according to an exemplary embodiment, a directional sputtering is used to punch through the adhesion layer 1002/metallic liner 1004 at the bottom of the vias 902 as well as the passivation layer 702, to expose the landing pads 802 beneath the vias 902. Directional sputtering is carried out via ion bombardment using, e.g., argon (Ar), helium (He), neon (Ne), xenon (Xe), nitrogen ($N_2$), hydrogen ($H_2$), $NH_3$ or $N_2H_2$ (or mixture of the same). By way of example only, the chamber pressure for the ion bombardment can be about $1 \times 10^{-3}$ torr.

Figure 12:
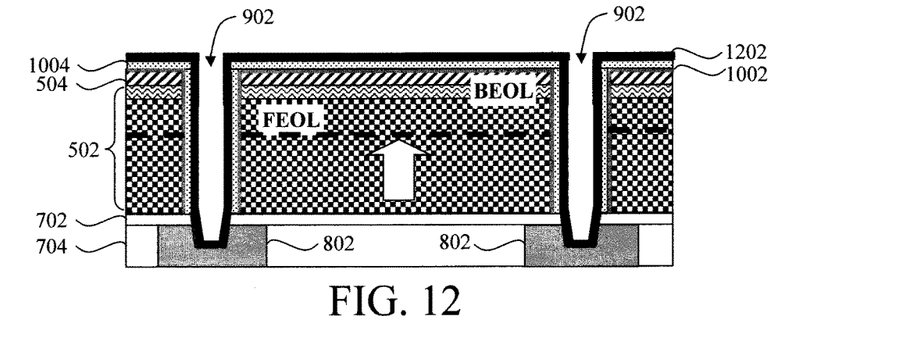
FIG. 12 is a cross-sectional diagram illustrating a dielectric having been deposited onto the metallic liner and onto the exposed landing pads at the bottom of the vias according to an embodiment of the present invention.

A dielectric 1202 is then deposited onto the metallic liner 1004/exposed landing pads 802. See FIG. 12. The dielectric 1202 separates the outer metal layer from the inner metal core of the TSV capacitors. Suitable dielectrics 1202 include, but are not limited to, $SiO_2$, tantalum oxide ($Ta_2O_5$), SiN, phosphorous-doped SiN ($PSiN_x$), silicon oxynitride (SiON), SiC, tantalum oxide ($TaO_2$), zirconium dioxide ($ZrO_2$), hafnium oxide ($HfO_2$), aluminum oxide ($Al_2O_3$), and combinations of at least one of the foregoing, such as a multilayer of an oxide-nitride-oxide each selected from the foregoing list (e.g., $SiO_2$—SiN—$SiO_2$). According to an exemplary embodiment, the dielectric 1202 is a high-κ dielectric, such as $ZrO_2$, $HfO_2$ and/or $Al_2O_3$. The term "high-κ" as used herein refers to a material having a relative dielectric constant κ which is much higher than that of silicon dioxide (e.g., a dielectric constant κ=25 for $HfO_2$ rather than 4 for silicon dioxide). According to an exemplary embodiment, the dielectric 1202 is deposited using a conformal deposition process such as ALD or CVD and, as shown in FIG. 12, lines the metallic liner 1004 along the sidewalls of the vias 902 and the exposed landing pads 802 at the bottom of the vias 902.

Figure 13:
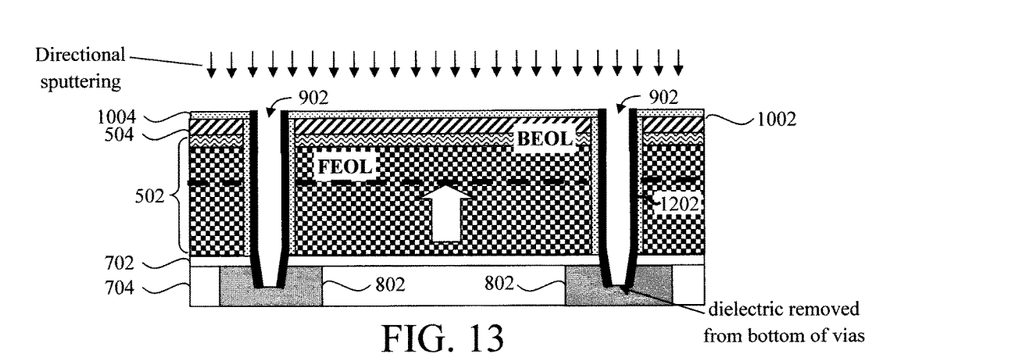
FIG. 13 is a cross-sectional diagram illustrating the dielectric having been removed from the bottoms of the vias according to an embodiment of the present invention.

The dielectric 1202 is then removed from the bottoms of the vias 902. See FIG. 13. According to an exemplary embodiment, this is done via a directional sputtering process. By removing the dielectric 1202 from the bottom of the vias 902, the metal cores of the TSVs (i.e., the second electrode of the capacitor) can contact the landing pads 802. As shown in FIG. 13, this process will also remove the dielectric 1202 from the horizontal surfaces of the metallic liner 1004.

Figure 14:
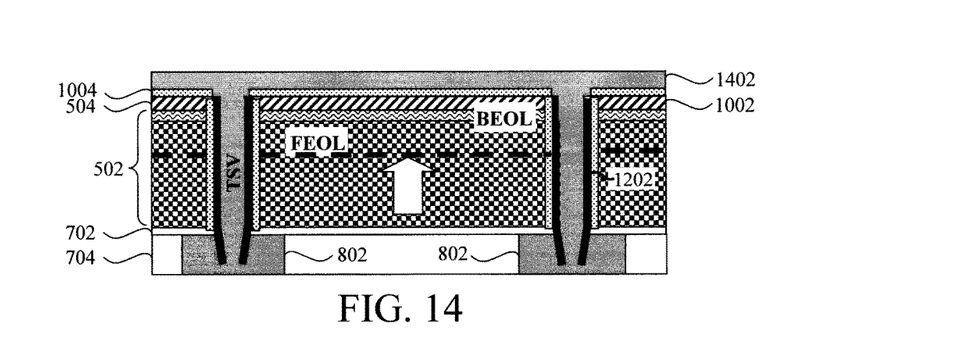
FIG. 14 is a cross-sectional diagram illustrating the vias having been filled with a metal according to an embodiment of the present invention.

The vias 902 are then filled with a metal 1402. See FIG. 14. Metal 1402 is the metal core that serves as the second electrode of the TSV capacitor, and may also be referred to herein as a second metal/second metal layer. According to an exemplary embodiment, metal 1402 is Cu. In that case, it is desirable to first deposit a liner/barrier layer (not shown) into the vias 902. As provided above, suitable barrier materials include, but are not limited to, TaN, TiN, WN, $SiO_2$, and/or SiN. Cu can be deposited into the vias 902 using an electroplating process. Since electroplating cannot occur onto a dielectric, a thin (e.g., from about 10 nanometers (nm) to about 50 nm, and ranges therebetween) Cu seed layer is first deposited into the vias 902 using a deposition process such as physical vapor deposition (PVD), ALD or CVD. The Cu fill can then be electroplated onto the Cu seed layer. As shown in FIG. 14, the metal 1402 in vias 902 is in contact with landing pads 802.

Figure 15:
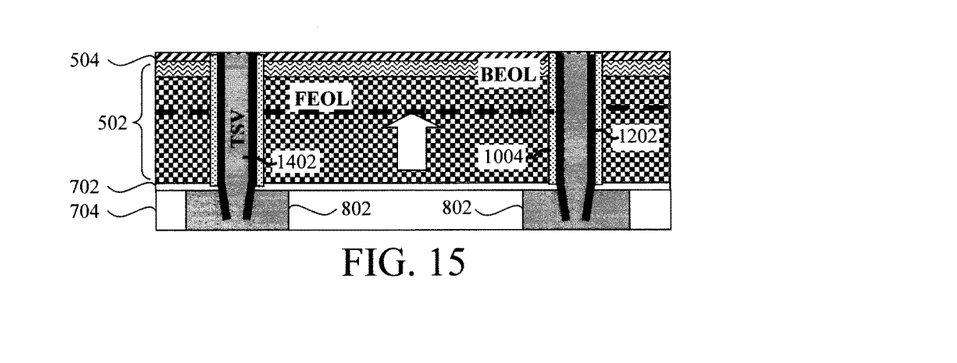
FIG. 15 is a cross-sectional diagram illustrating excess metal fill into the vias having been removed according to an embodiment of the present invention.

In order to prevent shorting between the electrodes, any excess metal 1402 fill into the vias 902 is removed. See FIG. 15. According to an exemplary embodiment, the excess metal is removed using CMP. As shown in FIG. 15, this CMP etch serves to remove metal 1402 as well as the metallic liner 1004 from the surface of the passivation layer 504. At this point, the metal 1402 is coplanar with a (top) surface of the passivation layer 504.

The metal 1402 (i.e., the metal core forming the second electrode of the capacitor) is then recessed in the vias 902. See FIG. 16. This metal recess can be performed using a selective (e.g., Cu-selective) wet etching process.

It is notable that in both the front-to-back and back-to-back bonding schemes, the metal core (i.e., metal 1402) of the capacitor in the top wafer should be in contact with the metal core (i.e., metal 1402) of the capacitor in the bottom wafer. However, the outer electrodes (i.e., metallic liner 1004) of the capacitors in the respective wafers should not be in contact with one another. With a back-to-back wafer bonding scheme this is easily done, via mating of the landing pads. See, for example, FIG. 4—described above. However, in the front-to-back bonding scheme (see, for example, FIG. 3), in order to establish contact between the metal cores of the capacitors, and to keep the outer electrodes in a non-contact position, rather than recessing the metal core of the bottom wafer (e.g., Chip 2 in FIG. 3), it is preferable instead to recess the outer electrodes (i.e., metallic liner 1004) of the capacitor in the bottom wafer. See, for example, FIG. 16A. This can be done for instance by masking the inner electrode metal core (i.e., metal 1402) of the bottom wafer and then performing the metal recess etch as described above.

Figure 18:
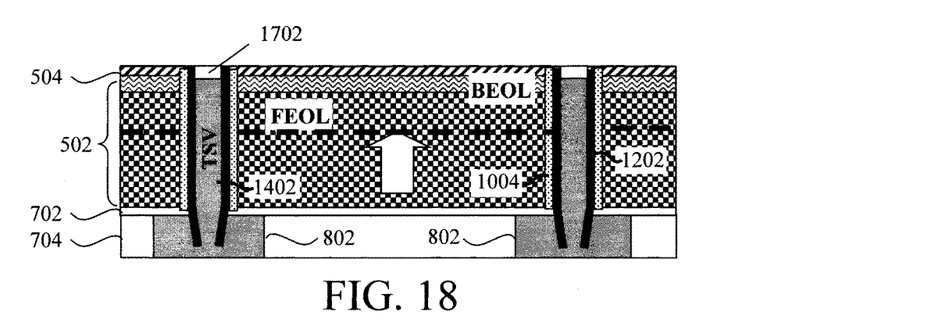
FIG. 18 is a cross-sectional diagram illustrating excess dielectric having been removed such that the dielectric is only present in the recesses on top of the TSV metal core according to an embodiment of the present invention.

Following the recess etch, a dielectric 1702 is then deposited onto the front of the substrate 502, filling the recesses. See FIG. 17. Suitable materials for dielectric 1702 include, but are not limited to, low-κ dielectrics such as organosilicate glass (a dielectric containing Si, carbon (C), oxygen (O) and hydrogen (H)) which can be deposited using a process such as plasma-enhanced CVD (PECVD). The goal is to have the dielectric 1702 only present in the recesses on top of the TSV metal core. Thus, as shown in FIG. 18, excess dielectric 1702 is removed using, e.g., a process such as CMP. Alternatively, when the metallic liner (as opposed to the metal core) is recessed (see FIG. 16A), this process will result in the dielectric 1702 filling the recesses on top of the metallic liner (as noted above, this is specific to the bottom wafer in the front-to-back bonding scheme). The result is shown in FIG. 3 (see Chip 2).

Figure 19:
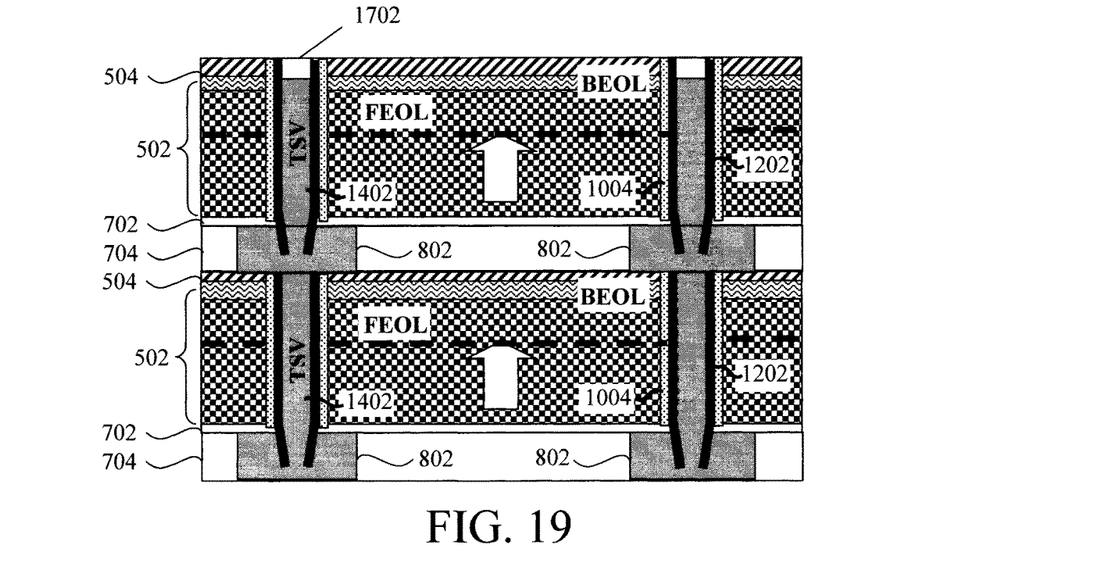
FIG. 19 is a cross-sectional diagram illustrating two of the wafers having been bonded together in a front-to-back manner according to an embodiment of the present invention.
Figure 20:
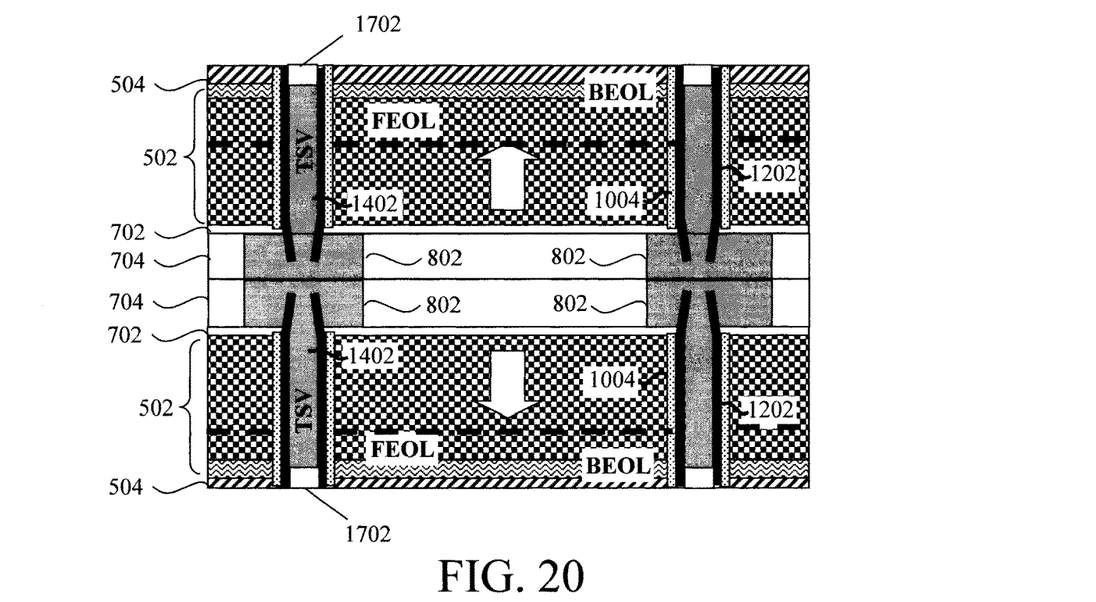
FIG. 20 is a cross-sectional diagram illustrating two of the wafers having been bonded together in a back-to-back manner according to an embodiment of the present invention.

The wafers are now ready for bonding. As provided above, it is assumed herein that at least two wafers are prepared using the above-described process and that the individual wafers, once complete, are then bonded together in a front-to-back or a back-to-back manner. See FIG. 19 and FIG. 20, respectively. Standard wafer bonding techniques may be employed, whereby metal-to-metal (e.g., Cu-to-Cu) and/or dielectric-to-dielectric bonds are formed. As shown in FIGS. 19 and 20, once the wafers are bonded, the corresponding (second electrode) metal cores of the TSV capacitors are in physical/electrical contact with one another.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A stacked capacitor structure, comprising:
   a first substrate having at least one first capacitor formed in a through-substrate via (TSV) in the first substrate; and
   a second substrate, bonded to the first substrate, having at least one second capacitor formed in a TSV in the second substrate,
   wherein the first capacitor and the second capacitor each comprises a first electrode and a dielectric that both surround a second electrode that is at a core of the TSV, wherein the dielectric separates the first electrode from the second electrode, and wherein the second substrate is bonded to the first substrate such that the first capacitor is stacked on the second capacitor.

2. The stacked capacitor structure of claim 1, wherein the second substrate is bonded to the first substrate in a front-to-back manner.

3. The stacked capacitor structure of claim 1, wherein the second substrate is bonded to the first substrate in a back-to-back manner.

4. The stacked capacitor structure of claim 1, wherein the first capacitor and the second capacitor each further comprises a landing pad in contact with the second electrode.

5. The stacked capacitor structure of claim 1, wherein the first electrode comprises a metal selected from the group consisting of: ruthenium, cobalt, iridium, gold, titanium, tantalum, and combinations thereof.

6. The stacked capacitor structure of claim 1, wherein the dielectric comprises a material selected from the group consisting of: silicon oxide, tantalum oxide, silicon nitride, phosphorous-doped silicon nitride, silicon oxynitride, silicon carbide, tantalum oxide, zirconium dioxide, hafnium oxide, aluminum oxide, and combinations thereof.

7. The stacked capacitor structure of claim 1, wherein the dielectric comprises a material selected from the group consisting of: silicon dioxide ($SiO_2$), tantalum oxide ($Ta_2O_5$), silicon nitride (SiN), phosphorous-doped SiN ($PSiN_x$), silicon oxynitride (SiON), silicon carbide (SiC), tantalum oxide ($TaO_2$), zirconium dioxide ($ZrO_2$), hafnium oxide ($HfO_2$), aluminum oxide ($Al_2O_3$), and combinations thereof.

8. The stacked capacitor structure of claim 1, wherein the dielectric comprises a high-κ material.

9. The stacked capacitor of claim 8, wherein the high-κ material is selected from the group consisting of: $ZrO_2$, $HfO_2$, $Al_2O_3$, and combinations thereof.

10. The stacked capacitor structure of claim 1, wherein the second electrode comprises copper.

11. The stacked capacitor structure of claim 1, wherein the first substrate has multiple first capacitors.

12. The stacked capacitor structure of claim 1, wherein the second substrate has multiple second capacitors.

13. The stacked capacitor structure of claim 1, further comprising:
    a first dielectric passivation layer on the first substrate through which the TSV in the first substrate passes; and
    a second dielectric passivation layer on the second substrate through which the TSV in the second substrate passes.

14. The stacked capacitor structure of claim 13, wherein the first dielectric passivation layer and the second dielectric passivation layer each comprises a material selected from the group consisting of: silicon nitride (SiN), silicon carbide (SiC), $SiO_2$, and combinations thereof.

15. The stacked capacitor structure of claim 1, wherein the first substrate and the second substrate each have a thickness of from about 50 µm to about 200 µm, and ranges therebetween.

16. The stacked capacitor structure of claim 1, further comprising:
    at least one first landing pad on a backside of the first substrate; and
    at least one second landing pad on a backside of the second substrate.

17. The stacked capacitor structure of claim 16, wherein the at least one first landing pad and the at least one second landing pad are formed from copper.

18. The stacked capacitor structure of claim 1, further comprising:
    a conformal adhesion layer lining the TSV in the first substrate and the TSV in the second substrate;
    a conformal metallic liner disposed on the conformal adhesion layer.

19. The stacked capacitor structure of claim 18, wherein the conformal adhesion layer comprises a material selected from the group consisting of: tantalum nitride (TiN), titanium nitride (TiN), tungsten nitride (WN), $SiO_2$, SiN, and combinations thereof.

20. The stacked capacitor structure of claim 18, wherein the conformal metallic liner comprises a material selected from the group consisting of: ruthenium (Ru), cobalt (Co), iridium (Ir), gold (Au), titanium (Ti), tantalum (Ta), and combinations thereof.

* * * * *